United States Patent
Farnham et al.

(10) Patent No.: US 9,815,947 B2
(45) Date of Patent: Nov. 14, 2017

(54) SUBSTANTIALLY SYMMETRICAL 3-ARM STAR BLOCK COPOLYMERS

(71) Applicant: E I DU PONT DE NEMOURS AND COMPANY, Wilmington, DE (US)

(72) Inventors: William Brown Farnham, Hockessin, DE (US); Michael Thomas Sheehan, Corpus Christi, TX (US); Hoang Vi Tran, Wilmington, DE (US); Daqing Zhang, Wilmington, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 15/335,803

(22) Filed: Oct. 27, 2016

(65) Prior Publication Data

US 2017/0121468 A1 May 4, 2017

Related U.S. Application Data

(60) Provisional application No. 62/248,633, filed on Oct. 30, 2015.

(51) Int. Cl.
| | |
|---|---|
| C08F 293/00 | (2006.01) |
| C08G 83/00 | (2006.01) |
| B05D 1/00 | (2006.01) |
| B05D 1/02 | (2006.01) |
| B05D 1/18 | (2006.01) |

(52) U.S. Cl.
CPC ........... C08G 83/003 (2013.01); B05D 1/005 (2013.01); B05D 1/02 (2013.01); B05D 1/18 (2013.01); C08F 293/005 (2013.01); C08F 2438/03 (2013.01)

(58) Field of Classification Search
CPC . C08F 2438/03; C08F 293/005; C08G 83/003
See application file for complete search history.

(56) References Cited

U.S. PATENT DOCUMENTS

| | | | | |
|---|---|---|---|---|
| 5,249,743 A | * | 10/1993 | Leingang | E01B 7/22 238/264 |
| 7,521,094 B1 | | 4/2009 | Cheng et al. | |
| 2006/0069203 A1 | * | 3/2006 | Lewis | A61K 9/1075 524/556 |
| 2008/0093743 A1 | | 4/2008 | Yang et al. | |
| 2008/0299353 A1 | | 12/2008 | Stoykovich et al. | |
| 2010/0113666 A1 | * | 5/2010 | Bzducha | C08F 8/12 524/379 |
| 2010/0273949 A1 | * | 10/2010 | Jakubowski | A61K 8/8152 525/221 |
| 2010/0294740 A1 | | 11/2010 | Cheng et al. | |
| 2012/0004381 A1 | * | 1/2012 | Rizzardo | C07C 329/20 526/204 |
| 2013/0230705 A1 | | 9/2013 | Nealey et al. | |

FOREIGN PATENT DOCUMENTS

WO 2011/151109 A1 12/2011

OTHER PUBLICATIONS

K.W. Guarini et al., "Optimization of Diblock Copolymer Thin Film Self Assembly", Advanced Materials, 2002, V. 14, No. 18, pp. 1290-1294.

S.O. Kim et al., "Epitaxial Self-Assembly of Block Copolymers on Lithographically Defined Nanopatterned Substrates", Nature, Jul. 2003, vol. 424, pp. 411-441.

Matyjaszewski et al., "Synthesis, Characterization, and Properties of Starlike Poly(n-butyl acrylate)-b-poly (mehtyl methacrylate) Block Copolymers", Macromolecules, 2010, vol. 43, pp. 1227-1235.

Directed Self-assembly of Block Copolymers for Nano-manufacturing, Roel Gronheid and Paul Nealey, eds., Elsevier, 2015; chapter 3, X. Yu, Y. Han (copy not submitted).

Cheng et al., "Fabrication of nanostructures with long-range order using block copolymer lithography", Applied Physics Letters, 2002, vol. 81, No. 19, p. 3657.

Cheng et al., "Templated Self-Assembly of Block Copolymers: Top-Down Helps Bottom-Up", Advanced Materials 2006, vol. 18, No. 19, pp. 2505-2521.

Introduction to Microlithography, second edition, edited by Larry F. Thompson, C. Grant Willson and Murrae J. Bowden, American Chemical Society, Washington, D.C., 1994 (copy not submitted).

\* cited by examiner

*Primary Examiner* — Mark Kaucher

(57) ABSTRACT

In a first aspect, a composition of matter includes a substantially symmetrical 3-arm star block copolymer having a central core and diblock copolymer arms having inner blocks and outer blocks. In a second aspect, an article includes a substrate, a block copolymer composition on the substrate, and a neutral layer between the substrate and the block copolymer composition.

11 Claims, No Drawings

SUBSTANTIALLY SYMMETRICAL 3-ARM STAR BLOCK COPOLYMERS

FIELD OF THE INVENTION

This invention relates to substantially symmetrical 3-arm star copolymers with diblock arms. Such copolymers contain segments ("blocks") of polymers with significantly different interaction parameters and can be used in directed self-assembly applications.

BACKGROUND

Directed self-assembly (DSA) is a technique in which copolymers such as diblock copolymers (BCP, also referred to herein as block copolymers or block polymers) containing dissimilar and non-intermixing blocks self-segregate into domains of homogeneous blocks. These domains may yield random patterns or, when directed, give well-defined and highly regular structures dictated by the molecular weight of each block. The ability of DSA to provide very small (sub-20-nm) features has quickly moved this technology into consideration as a viable option for integrated circuit production and semiconductor manufacturing processes.

DSA has also been investigated as a method for preparing nano-structured surfaces with unique surface physical properties. Possible applications include changing the hydrophobicity of surfaces due to incorporation of nano-structures and providing sites for unique chemical catalysts. DSA has promising applications in biomedical areas, including: drug delivery; protein purification, detection, and delivery; gene transfection; antibacterial or antifouling materials; and cytomimetic chemistry.

Block copolymers have been extensively investigated because of their diverse self-assembled structures such as spheres, cylinders, gyroids, and lamellae depending on the volume fraction of the blocks (F), the degree of polymerization (N), the Flory-Huggins interaction parameter (X, or chi), and the molecular architecture of the block copolymers. These nano-structures have been widely used for various applications such as templates, membranes, optical materials, and data storage media.

Compared with linear diblock copolymers, diverse architectures of copolymers such as miktoarm star copolymers or "star-shaped" copolymers have been explored because of the expectation of different morphologies or physical properties induced by different molecular architecture. Recently, it has been shown, for example, that unimolecular micelles composed of star-shaped copolymers have a tendency toward higher stability than the micelles made of diblock copolymers because the arms of the star-shaped copolymer are covalently linked to the core.

As mentioned above, the ability to self-assemble is dependent on the Flory-Huggins Interaction Parameter (X). Higher values of X (i.e., high-chi) allow for lower molecular weight polymers to assemble, leading to smaller block domains and hence feature sizes, since the natural feature pitch ($L_o$) of lamellae-forming diblock copolymers is proportional to the degree of polymerization. It also allows for greater thermodynamic driving force to direct assembly onto either physically or chemically differentiated surfaces. To meet the needs of applications such as magnetic storage and semiconductor devices, many recent efforts have been aimed at achieving long-range ordering, good feature registration, and accurate pattern placement with very few defects. For example, a thin film of polystyrene/poly(methyl methacrylate) diblock copolymers (PS-b-PMMA) can be spin-cast from a dilute toluene solution, then annealed, to form a hexagonal array of poly(methyl methacrylate) cylinders in a matrix of polystyrene (K. W. Guarini et al., Adv. Mater. 2002, 14, No. 18, 1290-4). Patterns of parallel lines have also been produced using PS-b-PMMA on chemically nano-patterned substrates (S. O. Kim et al., Nature, 2003, 424, 411-4).

Although there have been reports of using blends of diblock copolymers with the corresponding homopolymer(s) in forming patterns via directed self-assembly (U.S. Patent Application Publication No. 2008/0299353 A1), it is believed that there could be advantages in using block copolymers that are substantially free of homopolymer contaminants so that the composition of such blends can be more precisely controlled. However, it can be quite difficult to achieve the desired level of purity of the diblock copolymer without resorting to complex time and resource intensive procedures and/or without sacrificing yield. Examples of attempts to achieve this desired end result are disclosed in U.S. Pat. No. 7,521,094; U.S. Patent Application Publication Nos. 2008/0093743 A1; 2008/0299353 A1; 2010/0294740 A1; and PCT Publication No. WO 2011/151109. However, none of these procedures produced a product suitable for DSA applications.

Alternate architectures containing diblock segments have been examined for use in DSA, for example, linear triblock structures (U.S. Patent Application Publication No. 2013/0230705 A1), which exhibit advantages in assembly. Assembly properties of complex, asymmetric star structures have also been examined and found to be kaleidoscopic in phase diagram and morphological properties. Star architectures comprising identical diblock arms constrained by tethered chain ends to a single carbon atom gives entropic advantages in assembly, allowing for more regular assembly at smaller critical dimension versus that provided by the corresponding simple diblock systems. Star architectures also give more regularly ordered assembly by comparison with linear triblock, or simple diblock systems. It is known in the art (U.S. Patent Application Publication No. 2013/0230705 A1) that linear triblock architectures can provide advantages in assembly by comparison with corresponding diblock systems. For DSA utility, however, extreme regularity is the figure of merit, not "difficult-to-control" complexity. Thus, there is a need for a star-shaped copolymer which meets the requirements of DSA.

SUMMARY

In a first aspect, a composition of matter includes a substantially symmetrical 3-arm star block copolymer having a central core and diblock copolymer arms having inner blocks and outer blocks. The central core includes a structure having the formula $R_1C[(AO)(C(O)(CH_2)_2C(CH_3)(CN))SC(S)Z]_3$, wherein $R_1$ is selected from the group consisting of H, $CH_3$, and $C_2H_5$; A is selected from the group consisting of $CH_2$, and 4-substituted $C_6H_4$; and Z is SR, wherein R is selected from the group consisting of $C_1$-$C_4$ alkyl, $C_{12}H_{25}$ and $C_6H_5$. The inner blocks are derived from the polymerization of Monomer 1,

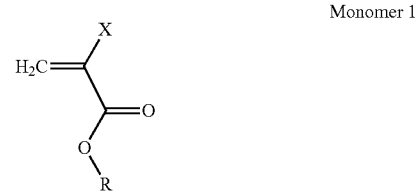
Monomer 1 wherein X is H or methyl, R is selected from the group consisting of $C_1$-$C_8$ alkyl and partially fluorinated alkyl groups, optionally substituted with hydroxyl or protected hydroxyl groups; and $C_3$-$C_8$ cycloalkyl groups. The outer blocks are covalently attached to the inner blocks, wherein the outer blocks are derived from the polymerization of Monomer 2,

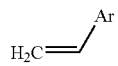

Monomer 2 wherein Ar is selected from the group consisting of a pyridyl group, a phenyl group, or a phenyl group having substituents selected from the group consisting of alkyl, hydroxyl, acetoxy, $C_1$-$C_4$ alkoxy groups, and —OC(O)OR', where R' is selected from the group consisting of $C_1$-$C_8$ alkyl groups.

In a second aspect, an article includes a substrate, a block copolymer composition on the substrate, and a neutral layer between the substrate and the block copolymer composition. The block copolymer composition includes a substantially symmetrical 3-arm star block copolymer having a central core, an inner block and an outer block. The central core includes a structure having the formula $R_1C[(AO)(C(O)(CH_2)_2C(CH_3)(CN))SC(S)Z]_3$, wherein $R_1$ is selected from the group consisting of H, $CH_3$, and $C_2H_5$; A is selected from the group consisting of $CH_2$, and 4-substituted $C_6H_4$; and Z is SR, wherein R is selected from the group consisting of $C_1$-$C_4$ alkyl, $C_{12}H_{25}$ and $C_6H_5$. The inner block is derived from the polymerization of Monomer 1,

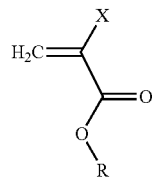

Monomer 1 wherein X is H or methyl, R is selected from the group consisting of $C_1$-$C_8$ alkyl and partially fluorinated alkyl groups, optionally substituted with hydroxyl or protected hydroxyl groups; and $C_3$-$C_8$ cycloalkyl groups. The outer block is covalently attached to the inner block, wherein the outer block is derived from the polymerization of Monomer 2,

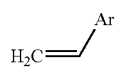

Monomer 2 wherein Ar is selected from the group consisting of a pyridyl group, a phenyl group, or a phenyl group having substituents selected from the group consisting of alkyl, hydroxyl, acetoxy, $C_1$-$C_4$ alkoxy groups, and —OC(O)OR', where R' is selected from the group consisting of $C_1$-$C_8$ alkyl groups.

In a third aspect, a composition of matter has the following formula:

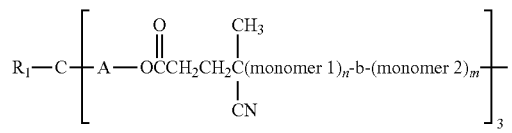

wherein:

(a) $R_1$ is selected from the group consisting of H, $CH_3$, and $C_2H_5$;

(b) A is selected from the group consisting of $CH_2$, and 4-substituted $C_6H_4$;

(c) monomer 1 is an inner block and is derived from the polymerization of Monomer 1,

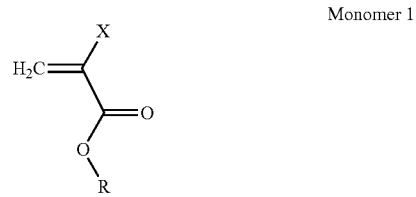

Monomer 1 wherein X is H or methyl, R is selected from the group consisting of $C_1$-$C_8$ alkyl and partially fluorinated alkyl groups, optionally substituted with hydroxyl or protected hydroxyl groups; and $C_3$-$C_8$ cycloalkyl groups; and (d) monomer 2 is an outer block covalently attached to the inner block and is derived from the polymerization of Monomer 2,

Monomer 2 wherein Ar is selected from the group consisting of a pyridyl group, a phenyl group, or a phenyl group having substituents selected from the group consisting of hydroxyl, acetoxy, $C_1$-$C_4$ alkoxy groups, and —OC(O)OR', where R' is selected from the group consisting of $C_1$-$C_8$ alkyl groups;

(e) n is in the range of from about 10 to about 1,000; and (f) m is in the range of from about 10 to about 1,000.

The foregoing general description and the following detailed description are exemplary and explanatory only and are not restrictive of the invention, as defined in the appended claims.

DETAILED DESCRIPTION

In a first aspect, a composition of matter includes a substantially symmetrical 3-arm star block copolymer having a central core and diblock copolymer arms having inner blocks and outer blocks. The central core includes a structure having the formula $R_1C[(AO)(C(O)(CH_2)_2C(CH_3)(CN))SC(S)Z]_3$, wherein $R_1$ is selected from the group consisting of H, $CH_3$, and $C_2H_5$; A is selected from the group consisting of $CH_2$, and 4-substituted $C_6H_4$; and Z is SR, wherein R is selected from the group consisting of $C_1$-$C_4$ alkyl, $C_{12}H_{25}$ and $C_6H_5$. The inner blocks are derived from the polymerization of Monomer 1,

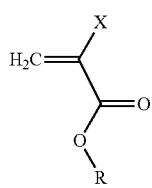

Monomer 1 wherein X is H or methyl, R is selected from the group consisting of $C_1$-$C_8$ alkyl and partially fluorinated alkyl groups, optionally substituted with hydroxyl or protected hydroxyl groups; and $C_3$-$C_8$ cycloalkyl groups. The outer blocks are covalently attached to the inner blocks, wherein the outer blocks are derived from the polymerization of Monomer 2,

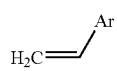

Monomer 2 wherein Ar is selected from the group consisting of a pyridyl group, a phenyl group, or a phenyl group having substituents selected from the group consisting of alkyl, hydroxyl, acetoxy, $C_1$-$C_4$ alkoxy groups, and —OC(O)OR', where R' is selected from the group consisting of $C_1$-$C_8$ alkyl groups.

In one embodiment of the first aspect, Monomers 1 and 2 are selected such that the difference between the total surface energy values of a homopolymer of Monomer 1 and a homopolymer of Monomer 2 is greater than 10 dynes/cm.

In another embodiment of the first aspect, the inner blocks include 5-95 wt % of the diblock copolymer arms.

In yet another embodiment of the first aspect, the weight average molecular weight of the substantially symmetrical 3-arm star block copolymer is between 5,000 and 250,000.

In still yet another embodiment of the first aspect, R is selected from the group consisting of methyl, cyclohexyl, and a partially fluorinated alkyl group. In a more specific embodiment, the partially fluorinated alkyl group is selected from the group consisting of —CH$_2$C(CF$_3$)$_2$OH, —CH$_2$CH$_2$CH$_2$CF$_2$C$_4$F$_9$, —CH$_2$CH$_2$C$_6$F$_{13}$, and -octafluoropentyl.

In a further embodiment of the first aspect, Ar is selected from the group consisting of pyridyl, phenyl, acetoxyphenyl, methoxyphenyl, and phenyl substituted with OC(O)OR', where R' is t-Bu.

In yet a further embodiment of the first aspect, the inner block is derived from the polymerization of a monomer selected from the group consisting of isobornyl methacrylate, trifluoroethyl methacrylate, trifluoropropyl methacrylate, hexafluoroisopropyl methacrylate, octafluoropentyl methacrylate, CH$_2$=C(CH$_3$)CO$_2$CH$_2$C(CF$_3$)$_2$OH and its protected analogues, CH$_2$=C(CH$_3$)CO$_2$CH$_2$CH$_2$CH$_2$CF$_2$C$_4$F$_9$, CH$_2$=C(CH$_3$)CO$_2$CH$_2$CH$_2$C$_6$F$_{13}$, CH$_2$=C(CH$_3$)CO$_2$CH$_2$CH$_2$C$_4$F$_9$, CH$_2$=C(CH$_3$)CO$_2$CH$_2$CH$_2$C$_3$F$_7$, CH$_2$=C(CH$_3$)CO$_2$CH$_2$C$_2$F$_5$, and CH$_2$=C(CH$_3$)CO$_2$CH$_2$C$_3$F$_7$.

In a second aspect, an article includes a substrate, a block copolymer composition on the substrate, and a neutral layer between the substrate and the block copolymer composition. The block copolymer composition includes a substantially symmetrical 3-arm star block copolymer having a central core, an inner block and an outer block. The central core includes a structure having the formula R$_1$C[(AO)(C(O) (CH$_2$)$_2$C(CH$_3$)(CN))SC(S)Z]$_3$, wherein R$_1$ is selected from the group consisting of H, CH$_3$, and C$_2$H$_5$; A is selected from the group consisting of CH$_2$, and 4-substituted C$_6$H$_4$; and Z is SR, wherein R is selected from the group consisting of C$_1$-C$_4$ alkyl, C$_{12}$H$_{25}$ and C$_6$H$_5$. The inner block is derived from the polymerization of Monomer 1,

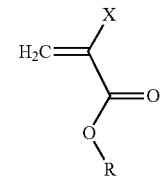

Monomer 1 wherein X is H or methyl, R is selected from the group consisting of $C_1$-$C_8$ alkyl and partially fluorinated alkyl groups, optionally substituted with hydroxyl or protected hydroxyl groups; and $C_3$-$C_8$ cycloalkyl groups. The outer block is covalently attached to the inner block, wherein the outer block is derived from the polymerization of Monomer 2,

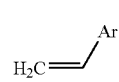

Monomer 2 wherein Ar is selected from the group consisting of a pyridyl group, a phenyl group, or a phenyl group having substituents selected from the group consisting of alkyl, hydroxyl, acetoxy, $C_1$-$C_4$ alkoxy groups, and —OC(O)OR', where R' is selected from the group consisting of $C_1$-$C_8$ alkyl groups.

In one embodiment of the second aspect, the substrate is pre-patterned with features selected from the group consisting of curved lines, straight lines, line segments, and dots.

In a third aspect, a composition of matter has the following formula:

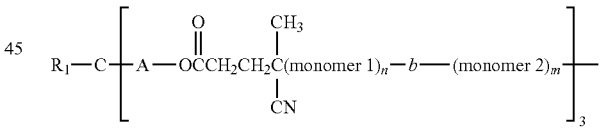

wherein:
(a) R$_1$ is selected from the group consisting of H, CH$_3$, and C$_2$H$_5$;
(b) A is selected from the group consisting of CH$_2$, and 4-substituted C$_6$H$_4$;
(c) monomer 1 is an inner block and is derived from the polymerization of Monomer 1,

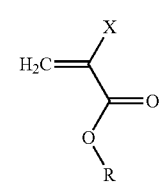

Monomer 1 wherein X is H or methyl, R is selected from the group consisting of $C_1$-$C_8$ alkyl and partially fluorinated alkyl groups, optionally substituted with hydroxyl or protected hydroxyl groups; and $C_3$-$C_8$ cycloalkyl groups; and (d) monomer 2 is an outer block covalently attached to the inner block and is derived from the polymerization of Monomer 2,

Monomer 2 wherein Ar is selected from the group consisting of a pyridyl group, a phenyl group, or a phenyl group having substituents selected from the group consisting of hydroxyl, acetoxy, $C_1$-$C_4$ alkoxy groups, and —OC(O)OR', where R' is selected from the group consisting of $C_1$-$C_8$ alkyl groups;

(e) n is in the range of from about 10 to about 1,000; and
(f) m is in the range of from about 10 to about 1,000.

The star architecture gives entropic advantages in assembly for block copolymers, allowing for better regularity in assembly at smaller critical dimensions versus that provided by simple diblock systems. In thin films, the star architecture also gives a more regularly ordered assembly by comparison with linear triblock, or simple diblock systems, allowing for improved etch selectivity, as well as tunable compositions for directed self-assembly applications.

Herein, the term "block copolymer" refers to a copolymer comprising blocks (i.e., segments) of different polymerized monomers. In the star architecture, the first-named monomer becomes the "inner monomer segment" (or "inner block") as it is directly attached to the core structure. The second-named monomer is directed to the arm ends and becomes the "outer monomer segment" (or "outer block"). The structure of the core is believed to be important, and cross-linked cores with distributions of the number of active chain growth sites, are excluded from consideration. The number of chain atoms connected as arms to a central carbon atom in the core must allow for unencumbered monomer access during polymerization and conformational flexibility after polymerization. For example, PMMA-b-PS is "diblock" copolymer comprising blocks of poly(methyl methacrylate) and polystyrene, which can be prepared using reversible addition fragmentation chain transfer (RAFT) processes by first polymerizing methyl methacrylate and then polymerizing styrene from the reactive end of the poly(methyl methacrylate) chains. Alternatively, PS-b-PMMA diblock copolymers could be made by anionic polymerization processes, but a substantially different core structure would be required. Atom transfer free radical polymerization (ATRP) could be employed (Matyjaszewski, et al, *Macromolecules* 2010, 43,1227, however, the system published would not function for the instant utility). Other methods, or combination of techniques taken in tandem, include atom transfer free radical polymerization (ATRP), ring-opening metathesis polymerization (ROMP), and living cationic or living anionic polymerizations.

"Diblock copolymers" can also be described by the monomer constituents alone, e.g., MMA-b-S is equivalent to PMMA-b-PS. For many purposes, the order of the monomers is largely immaterial to the function or use of the diblock copolymer, so that a PMMA-b-PS will behave very similarly to PS-b-PMMA, even though the diblock copolymers may have been made by different routes.

In one embodiment, a central core includes a structure having the formula $R_1C[(AO)\ )(C(O)(CH_2)_2C(CH_3)(CN))SC(S)Z]_3$, wherein $R_1$ is selected from the group consisting of H, $CH_3$, and $C_2H_5$; A is selected from the group consisting of $CH_2$, and 4-substituted $C_6H_4$; and Z is SR, wherein R is selected from the group consisting of $C_1$-$C_4$ alkyl, $C_{12}H_{25}$ and $C_6H_5$.

In one embodiment, inner blocks are derived from the polymerization of Monomer 1,

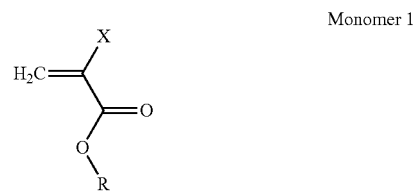

Monomer 1 wherein X is H or methyl, R is selected from the group consisting of $C_1$-$C_8$ alkyl and partially fluorinated alkyl groups, optionally substituted with hydroxyl or protected hydroxyl groups; and $C_3$-$C_8$ cycloalkyl groups.

In one embodiment, R is selected from the group consisting of methyl, cyclohexyl, and a partially fluorinated alkyl group. In a more specific embodiment, the partially fluorinated alkyl group is selected from the group consisting of —$CH_2C(CF_3)_2OH$, —$CH_2CH_2CH_2CF_2C_4F_9$, —$CH_2CH_2C_6F_{13}$, and -octafluoropentyl.

In one embodiment, the inner block is derived from the polymerization of a monomer selected from the group consisting of isobornyl methacrylate, trifluoroethyl methacrylate, trifluoropropyl methacrylate, hexafluoroisopropyl methacrylate, octafluoropentyl methacrylate, $CH_2$=$C(CH_3)CO_2CH_2C(CF_3)_2OH$ (FOHMAC) and its protected analogues, $CH_2$=$C(CH_3)CO_2CH_2CH_2CH_2CF_2C_4F_9$ (C4VDF-MA), $CH_2$=$C(CH_3)CO_2CH_2CH_2C_6F_{13}$ (C6-ZFM), $CH_2$=$C(CH_3)CO_2CH_2CH_2C_4F_9$ (C4-ZFM), $CH_2$=$C(CH_3)CO_2CH_2CH_2C_3F_7$ (C3-ZFM), $CH_2$=$C(CH_3)CO_2CH_2C_2F_5$, and $CH_2$=$C(CH_3)CO_2CH_2C_3F_7$.

In one embodiment, outer blocks are covalently attached to the inner blocks, wherein the outer blocks are derived from the polymerization of Monomer 2,

Monomer 2 wherein Ar is selected from the group consisting of a pyridyl group, a phenyl group, or a phenyl group having substituents selected from the group consisting of alkyl, hydroxyl, acetoxy, $C_1$-$C_4$ alkoxy groups, and —OC(O)OR', where R' is selected from the group consisting of $C_1$-$C_8$ alkyl groups.

Suitable monomers corresponding to Monomer 2 include styrene, alkylated styrenes, acetoxystyrene, methoxystyrene, ethoxystyrene, propoxystyrene, butoxystyrene, vinylpyridine, and styrenes substituted on the aromatic ring with —OC(O)OR' groups, where R' is selected from the group consisting of $C_1$-$C_8$ alkyl groups. In some embodiments, Monomer 2 is t-butoxystyrene or t-butoxycarbonyloxystyrene.

In its simplest form, the Flory-Huggins Interaction Parameter, X (chi), can be taken to be a measure of miscibility of a polymer and a small molecule or another polymer in a binary mixture. Diblock copolymers are said to be high-X when the two blocks are highly immiscible. The total surface energy, which is the sum of the polar surface energy and the dispersive surface energy, of the two blocks is related to the X of the copolymer and is easier to determine than X itself. The total surface energy can be determined by measuring the contact angles for water and decalin on a polymer surface and calculating the polar and dispersive surface energies for that surface by the method of Fowkes. One can use published or experimentally-determined values of the total surface energies of homopolymers of interest to select pairs of polymers with large differences in surface energies. Diblock copolymers comprising blocks of such polymer pairs will be high-X diblock copolymers. In one embodiment, Monomers 1 and 2 are selected such that the difference between the total surface energy values of a homopolymer of Monomer 1 and a homopolymer of Monomer 2 is greater than 10 dynes/cm.

The total surface energies of selected homopolymers are given in Table 1.

TABLE 1

| Polymer | Total Surface Energy (dynes/cm) |
| --- | --- |
| Poly(4-hydroxystyrene) | 45.0 |
| Poly(4-vinylpyridine) | 44.8 |
| Poly(hydroxyethyl methacrylate) | 41.2 |
| Poly(methyl methacrylate) | 38.4 |
| Poly(4-acetoxystyrene) | 38.3 |
| Poly(2-vinylpyridine) | 37.7 |
| Poly(4-methoxystyrene) | 36.6 |
| Poly(isobutyl methacrylate) | 35.7 |
| Poly(cyclohexyl methacrylate) | 34.1 |
| Poly(4-t-butoxystyrene) | 33.0 |
| Poly(isobornyl methacrylate) | 32.6 |
| Poly(styrene) | 31.7 |
| Poly(t-butyl methacrylate) | 29.7 |
| Poly(FOHMAC) | 25.8 |
| Poly(pentafluorostyrene) | 25.4 |
| Poly(octafluoropentyl methacrylate) | 20.1 |
| Poly(C6-ZFM) | 13.1 |

The inner block of the diblock copolymer can be prepared, for example, by RAFT polymerization methods, which provide polymers with narrow polydispersities. Typically, the methacrylate block is prepared first by polymerizing Monomer 1 using RAFT methods, and then the other block is built up by polymerizing Monomer 2 onto the living end of the methacrylate block.

In a RAFT polymerization (so-called "core-first"), an initiator is added under an inert atmosphere to a heated solution of Monomer 1, a solvent, and a trithiocarbonate (ttc) RAFT agent (e.g., $R_1C[(CH_2O)(C(O)(CH_2)_2C(CH_3)(CN))SC(S)Z]_3$), preferably at low radical flux so that the trithiocarbonate/initiator ratio is maintained at a high but essentially constant level. When the reaction is complete, the product (which will form the inner block of the diblock copolymer) is isolated by precipitation in a non-solvent.

The outer block of the diblock copolymer is typically formed from a styrene or vinylpyridine. This block can be prepared by adding a solution of Monomer 2 to a solution of the precipitated product of the RAFT polymerization and heating, preferably in the presence of low concentration radical initiator. Progress of the reaction can be followed by standard analytical techniques, e.g., $^1$H NMR, Raman spectroscopy. Initial isolation of the crude diblock product can be achieved by precipitation in a non-solvent. In one embodiment, the inner block comprises 5-95 wt % of the diblock copolymer arms. In one embodiment the weight average molecular weight of the substantially symmetrical 3-arm star block copolymer is between 5,000 and 250,000.

The lengths of the inner and outer blocks are determined by the degree of polymerization of each segment, and can be individually controlled. Typically, the ratio of the degree of polymerization for the two blocks is between 1:4 and 4:1.

In some embodiments, the Monomer 1 comprises a protected functional group which is removed after either the formation of the inner block or after the formation of the diblock copolymer. In some embodiments, Monomer 2 comprises a protected functional group which is deprotected after formation of the diblock copolymer.

Another aspect of this invention is an article comprising a substrate and a substantially symmetrical 3-arm star block copolymer composition disposed on the substrate. A critical need arising in this aspect is a suitable annealing process, whereby the inherent morphological properties of the macromolecules are utilized and oriented in a desired fashion. Thermal and solvent annealing methods have been reviewed recently (see "Directed Self-assembly of Block Copolymers for Nano-manufacturing", Roel Gronheid and Paul Nealey, eds., Elsevier, 2015; chapter 3, X. Yu, Y. Han), and these include oscillatory thermal schemes to reduce defect density, and various solvent vapor and solvo-thermal combination techniques. Solvent annealing is frequently used when kinetically trapped chain configurations, sometimes encountered in high-chi systems, cannot be otherwise unfrozen. The strategy of oscillation, as applied to solvent release from thin films has not received much attention. For the high-chi copolymer examples described in the Examples herein, repeated exposure to solvent followed by its release from the film (at ambient temperature and pressure) provides good assembly, as judged by Atomic Force Microscopy (AFM) imaging. Single exposure, regardless of the time interval used, is relatively ineffective. Since most of the solvent is released from the film in a short time period (1 to 5 seconds, depending on thickness), several iterations can be applied in short order. The preferred solvent for octafluoropentylmethacrylate-b-polystyrene (OPMA-b-PS) systems is propylene glycol monomethyl ether (PGME), selected for its vapor pressure, activity parameters, and H-bonding capability with the polar —$CF_2H$ pendant groups in the OPMA segments.

In one embodiment, suitable substrates include Si, quartz, GaAs, $Si_3N_4$, $Al_2O_3$, and polyimides. In some embodiments, the Si surface is an oxide, optionally coated with hexamethyldisilazane (HMDS). Usually, diblock systems require that a non-selective or neutral layer is first deposited on a substrate surface in order to achieve vertically aligned lamellae or other useful features. In some embodiments, a neutral layer is a random copolymer, e.g., of Monomer 1 and Monomer 2. In one embodiment, where the substrate is Si, the Si surface is coated with $R^1SiCl_3$ (or mixtures of such species) where $R^1$ is an alkyl group or a partially or fully fluorinated alkyl group. In one embodiment, the surface can be lithographically pre-patterned with features such as curved lines, straight lines, line segments, and dots before application of a neutral layer. In some embodiments, the block copolymer composition is deposited on the neutral layer and then solvent annealed or thermally annealed so that the diblock copolymers self-assemble into microdomains of 5 to 200 nm.

It has been found that substantially symmetrical 3-arm star block copolymers described herein can be used in directed self-assembly applications (DSA), in which structures can be formed at the nanoscale level. More particularly, substantially symmetrical 3-arm star block copolymers can be used to form devices having holes, vias, channels, or other structures at predetermined positions.

More particularly, structures formed via directed self-assembly may be useful in constructing semiconductor devices in which the critical dimensions are smaller than those currently accessible via standard lithographic and etching techniques. DSA patterning methods can take advantage of the small critical dimensions of BCP domains while at the same time providing precise control of BCP domain placement for arbitrary pattern layouts, thereby enabling higher resolution patterning. In addition, these methods are compatible with conventional optical lithography tools and imaging materials.

Under certain conditions, the blocks of the diblock copolymers described herein phase-separate into microdomains (also known as "microphase-separated domains" or "domains"), and in the process, nanoscale features of dissimilar chemical composition are formed. The ability of substantially symmetrical 3-arm star block copolymers to form such features makes them potentially useful in nanopatterning, and to the extent that features with smaller critical dimensions can be formed, this should enable the construction of features which would otherwise be difficult to print using conventional lithography. However, without any guidance from the substrate, the microdomains in a self-assembled block copolymer thin film are typically not spatially registered or aligned. To address the problem of spatial registration and alignment, graphoepitaxy can be used to enable directed self-assembly, in which self-assembly is guided by topographical features of lithographically pre-patterned substrates. BCP graphoepitaxy provides sub-lithographic, self-assembled features having a smaller characteristic dimension than that of the pre-pattern itself.

Some initial applications of DSA based on BCP graphoepitaxy have been reported. Directed self-assembly of block copolymers has been used to reduce the diameter of holes created with conventional lithographic methods, as illustrated in U.S. Patent Application Publication No. 2008/0093743 A1. With this technique, a solution containing a block copolymer is applied on a topographical substrate having openings therein, thereby filling the openings. Microphase-separated domains are then formed in the openings as a result of an annealing process. The discrete, segregated polymer domains formed in the centers of the openings are subsequently removed via an etch process to create holes that are smaller than the corresponding openings. Note, however, that the pitch of the pattern realized with this approach is unchanged from the pitch of the starting lithographic pre-pattern (i.e., there is no increase in pattern density).

Overall pattern density (related here to the smaller critical dimension (CD) and smaller pitch) has been increased by creating an array of self-assembled polymer domains in a lithographically defined trench (see Cheng et. al., *Applied Physics Letters,* 2002, 81, 3657). However, in this approach, there is effectively no control of the placement of each self-assembled domain, and hence no control over the final location of the corresponding holes generated as a result of the etch process. Thus, these holes do not form an array in which the domains have predetermined positions, and the standard deviation of these positions can vary from a precise array by as much as 10% of the average center-to-center domain spacing (see Cheng et. al., *Advanced Materials* 2006, 18, 2505).

One aspect of the present invention is a method that comprises providing a substrate having a surface comprising one or more directing structures, then applying, over the surface, a layer comprising a substantially symmetrical 3-arm star block copolymer, in which components of the copolymer are immiscible with one another. The polymer is allowed to form a plurality of discrete, segregated domains (e.g., an annealing process may be used to induce this self-assembly), in which the position of each discrete, segregated domain is predetermined by the directing structures.

In one embodiment, a polymer solution containing at least one substantially symmetrical 3-arm star block copolymer is prepared. Additional BCPs, homopolymers, copolymers, surfactants and photoacid generators can also be employed. Next, the solution is cast on the substrate having a segmented pre-pattern, to form well-registered polymer domains within the desired area. Increasing the mobility of the diblock copolymers (e.g., through thermal or solvent vapor treatment) may be required for certain polymers. For diblock copolymers for which the glass transition temperature is lower than room temperature, spontaneous self-assembly may occur. Additional annealing (including thermal annealing, thermal gradient annealing, solvent vapor annealing or some other gradient field) may be optionally employed to remove any defects. Finally, at least one self-assembled polymer domain is selectively removed to generate holes, which can then be transferred into the underlying substrate. For example, both bilayer (resist and transfer layer) and trilayer (resist, hard mask layer, transfer layer) schemes are possible (see, for example, "Introduction to Microlithography", second edition, edited by Larry F. Thompson, C. Grant Willson and Murrae J. Bowden, American Chemical Society, Washington, D.C., 1994). Prior to the pattern development and pattern transfer, the self-assembled polymer may be optionally chemically modified to improve properties necessary for pattern transfer, such as etch resistance or certain mechanical properties.

The substantially symmetrical 3-arm star block copolymer formulation may be applied by spin coating it onto the substrate, e.g., at a spin speed from about 1 rpm to about 10,000 rpm, with or without a post-drying process. Other processes may be used for applying the diblock copolymer formulation to the substrate, such as dip-coating and spray-coating.

As used herein, "phase-separate" refers to the propensity of the blocks of the block copolymers to form discrete microphase-separated domains, also referred to as "microdomains" and also simply as "domains." The blocks of the same monomer aggregate to form domains, and the spacing and morphology of domains depends on the interactions, volume fractions, and number of different blocks in the block copolymer. Domains of block copolymers can form spontaneously while applying them to a substrate such as during a spin-casting step, or they can form as a result of an annealing step. "Heating" or "baking" is a general process wherein the temperature of the substrate and coated layers thereon is raised above ambient temperature. "Annealing" can include thermal annealing, thermal gradient annealing, solvent vapor annealing, or other annealing methods, including solvothermal methods. Thermal annealing, sometimes referred to as "thermal curing" is used to induce phase separation, and in addition, can be used as a process for reducing or removing defects in the layer of lateral microphase-separated domains. It generally involves heating at elevated temperature above the glass transition temperature of the block copolymers, for a period of time (e.g., several minutes to several days). Time is an important element for large scale manufacture.

Solvents that can be used vary with the solubility requirements of the diblock copolymer components and the various additives, if any. Exemplary casting solvents for these components and additives include propylene glycol monomethyl ether acetate (PGMEA), propylene glycol monomethyl ether (PGME), ethoxyethyl propionate, anisole, ethyl lactate, 2-heptanone, cyclohexanone, amyl acetate, γ-butyrolactone (GBL), toluene, trifluorotoluene, and the like.

Additives can be selected from the group consisting of: additional polymers (including homopolymers, and copolymers, block copolymers, random copolymers, cross-linkable polymers, and inorganic-containing polymers), small molecules, nanoparticles, metal compounds, inorganic-containing molecules, surfactants, photoacid generators, thermal acid generators, base quenchers, hardeners, cross-linkers, chain extenders, and combinations comprising at least one of the foregoing, wherein one or more of the additives co-assemble with the block copolymer to form part of one or more of the self-assembled domains.

A substrate, as used herein, is a physical structure suitable for use with any of the methods described herein, including but not necessarily limited to substrates used in the semiconductor industry. This includes a physical body (e.g., a layer or a laminate, a material, and the like) onto which materials (such as polymers, polymeric materials, metals, oxides, dielectrics, etc.) may be deposited or adhered. The substrates herein may include semiconducting materials, insulating materials, conductive materials, or any combination thereof, including multilayered structures. Thus, for example, a substrate may comprise a semiconducting material such as Si, SiGe, SiGeC, SiC, GaAs, InAs, InP and other III/V or II/VI compound semiconductors. A substrate may comprise, for example, a silicon wafer or process wafer such as that produced in various steps of a semiconductor manufacturing process, such as an integrated semiconductor wafer. A substrate may comprise a layered substrate such as, for example, Si/SiGe, Si/SiC, silicon-on-insulators (SOIs) or silicon germanium-on-insulators (SGOIs). A substrate may comprise one or more layers such as a dielectric layer, a barrier layer for copper such as SiC, a metal layer such as copper, a hafnium dioxide layer, a silicon layer, a silicon oxide layer, the like, or combinations thereof. A substrate may comprise an insulating material such as an organic insulator, an inorganic insulator or a combination thereof including multilayers. A substrate may comprise a conductive material, for example, polycrystalline silicon (polySi), an elemental metal, alloys of elemental metals, a metal silicide, a metal nitride, or combinations thereof, including multilayers. A substrate may comprise ion implanted areas, such as ion implanted source/drain areas having p-type or n-type diffusions active to the surface of the substrate.

The substantially symmetrical 3-arm star block copolymer synthesis and assembly provides advantages over diblock and linear triblock copolymers, including the scalability of the $C_3$ core synthesis and isolation, improved feature pitch and morphology in thin films, which are determined mainly by the molecular weight and composition of the diblock copolymer arms, and better assembly properties, such as improved regularity in assembly at smaller critical dimensions.

In view of the above subject matter then, it can be seen that several inventive features are disclosed in the embodiments and examples herein, without any limitations:

EXAMPLES

Example 1

Preparation of 3-Arm Star Core RAFT ($C_3$-RAFT) Agent from 1,1,1-tris(hydroxymethyl)ethane (THME) and RAFTv2.0

In a dry box, a 3-neck round bottom flask fitted with stir-bar and Teflon® PTFE stoppers was charged with RAFTv2.0 (28.0 g, 69.5 mmol, Boron Molecular, Raleigh, N.C.), THME (2.40 g, 20.0 mmol), tetrahydrofuran (THF, 100 mL) and dimethylaminopyridine (0.73 g, 6 mmol). Dicyclohexylcarbodiimide (DCC, 14.8 g 71.8 mmol) was added as a solid in small portions at room temperature over a 40 min period.

After stirring for 16 hr, the reaction mixture was filtered and the solids were washed with a small volume of additional THF. THF was evaporated under reduced pressure, and the product was washed with isopropanol (3×100 mL), stirring (magnetic bar) at 35° C. during each wash cycle (20 min), then allowing the product phase to settle at 20-22° C. The upper, slightly turbid layers were decanted. The product was pumped to give 26.5 g heavy orange oil. A small amount of residual isopropanol obscured $^1$H NMR integration of downfield signal at ca. 4.04. Otherwise, the spectrum was in accord with the desired product with purity >99%. Before use in polymerization, the sample was treated with 20 mL methyl ethyl ketone (MEK), then evaporated and pumped to give 26.0 g of heavy orange oil. NMR estimate of MEK content=5.5 wt %; calculated yield=24.6 g (96%). LC-MS was consistent with the desired product: $C_{62}H_{105}N_3O_6S_9$ with [M+H] measured at 1276.556245 Da.

Example 2

Preparation of 3-Arm Star Core RAFT Agent from Tris(4-hydroxyphenyl)ethane (THPE) and RAFTv2.0

In the dry box, a 3-neck round bottom flask fitted with stir-bar and Teflon® PTFE stoppers was charged with RAFTv2.0 (12.7 g, 31.5 mmol), THPE (3.06 g, 10 mmol), THF (60 mL) and dimethylaminopyridine (DMAP, 0.366 g, 3.0 mmol). Dicyclohexylcarbodiimide (DCC, 7.40 g, 36 mmol) was added slowly in portions at room temperature. Byproduct urea was formed quickly, and the mixture was stirred for 22 hr. An additional charge of RAFTv2.0 (0.6 g) was added, and the mixture was stirred for an additional 5 hr. $^1$H NMR(CDCl$_3$): major aryl AB pattern 7.09, 7.01; minor AB 6.91, 6.75 (ratio=99/1), residual DMAP signals 8.2 and 6.52, CH$_2$ signals at 3.33 (SCH$_2$), 2.9 (C(O)CH$_2$), 2.63 and 2.48, 1.7, and 1.4, 1.3 envelope, CH$_3$ at 0.88. Integration was consistent with high conversion of RAFTv2.0 to corresponding ester product (ca. 99%).

The reaction mixture was filtered, and the solids were washed with THF. Combined liquid phases were evaporated under reduced pressure. The bulk of the evaporated product was diluted with a small amount of MEK (1 mL) and the stirred solution was treated with isopropanol to cause substantial phase separation of the product. The upper phase was decanted and the product was washed with additional isopropanol. To reduce the isopropanol content in the final isolated product, MEK was added and the solvent was removed under vacuum. $^1$H NMR(CDCl$_3$): contaminant signals were below detection level.

Example 3

Preparation of Low M$_w$ C$_3$-MMA-ttc

A 4-neck flask fitted with condenser, nitrogen gas inlet, thermocouple and initiator feed line, Raman probe, and an overhead stirrer assembly was charged with C$_3$-RAFT agent CH$_3$C[CH$_2$OC(O)CH$_2$CH$_2$C(CH$_3$)(CN)SC(S)SC$_{12}$H$_{25}$]$_3$ (FW=1275.5, eq. 2.38 g=5.61 mequiv trithiocarbonate ends), MEK (135 mL), and MMA (100 g 1.00 mol). Luperox® 26 initiator solution was prepared for syringe pump feeding as follows: 106 mg/20.0 mL, (0.0245 mmol/mL), using MEK as solvent. The reactor was purged with nitrogen for 20 min. The temperature was increased to 75° C., and 5.0 mL of initiator solution was fed. Initiator was fed at 0.30 mL/hr for 35.25 hr. MMA conversion was estimated as 91%. SEC (linear PMMA calibration): Mw=52350; Mn=48,750; Mz=55,480; PD=1.07. By comparison with runs using higher initiator concentrations, SEC overlay traces show better line-shape and molecular weight distribution as well as substantially smaller fraction of arm-coupled product. UV: A$_{309}$=0.806.

Example 4

Preparation of C$_3$-MMA-ttc

A 4-neck flask fitted with condenser, nitrogen gas inlet, thermocouple and initiator feed line, and an overhead stirrer assembly was charged with C$_3$-RAFT agent CH$_3$C[CH$_2$OC(O)CH$_2$CH$_2$C(CH$_3$)(CN)SC(S)SC$_{12}$H$_{25}$]$_3$ (2.38 g, 5.61 mequiv trithiocarbonate ends), MEK (110 mL), and MMA (80.0 g, 0.80 mol). Luperox® 26 initiator solution was prepared for syringe pump feeding as follows: 106 mg/20.0 mL, (0.0245 mmol/mL), using MEK as solvent. The reactor was purged with nitrogen for 20 min. The temperature was increased to 75° C., and 5.0 mL of initiator solution was added. Slow feed conditions (0.30 mL/hr) were established and continued for 18 hr. $^1$H NMR (CDCl$_3$) showed final MMA conversion estimated as 82%. Integration was consistent with arm Mn=11,420, or total Mn=34,250.

MEK-diluted solution was added slowly to methanol to precipitate. Filtration and drying gave 61.8 g of yellow solid. SEC (linear PMMA calibration): Mw=36,650; Mn=33,400; Mz=39,100; PD=1.10. UV (1.0 g/L, THF, 1 Cm): A$_{310}$=1.250.

Example 5

Preparation of Low M$_w$ C$_3$-MMA-b-S-ttc

A 3-neck 500 mL flask fitted with condenser, nitrogen gas inlet, thermocouple, Raman probe, and an overhead stirrer assembly was charged with 45.0 g of C$_3$-PMMA-ttc (Mw=36,650; calculated as 4.08 mequiv trithiocarbonate ends), 2-heptanone (75 g), and styrene (93.6 g, 0.90 mol). A nitrogen purge sequence was followed for 20 min. The reaction mixture was heated to 95° C. for 2 hr, 105° C. for 1 hr, and 114° C. for 20.5 hr. Styrene conversion was measured as 56%.

The reaction mixture was diluted with MEK (100 mL), heated to 50° C. to speed the formation of uniform solution, cooled, and transferred to a 3 L vessel. Hexanes (2 L) were added slowly with vigorous stirring to produce well-formed particles. After stirring for 0.5 hr, a fritted dip-tube was used to remove the bulk of the solvent. Hexane (1 L) was added and the mixture was stirred for 0.5 hr. The liquid phase was removed, and methanol (1 L) was added. After stirring 0.5 hr, the mixture was filtered and the solids were washed with methanol. 93.2 g of light yellow solids were obtained. The product was treated with cyclohexane (750 mL) and heated in a 45° C. bath (36° C. internal) for 0.5 hr. The liquid phase was removed at temperature with a fritted dip-tube, and the cyclohexane extraction step was repeated. After cooling to room temperature, the solids were collected by filtration, then treated with methanol, and dried. 89.4 g of solids were obtained. $^1$H NMR analysis: using integration of S and MMA polymer signals, monomer ratio in the polymer was calculated as MMA/S=49.4/50.6. Using the core CH$_2$O signal intensity, the overall Mn was estimated as=66,540. Estimated arm Mn=22,180 (overall for C$_3$-MMA-b-S,). SEC (vs. PMMA standards): Mw=74,900; Mn=66,900; Mz=82,900); PD=1.12. There was a very small fraction of arm-coupled product present. UV (1.0 g/L THF 1 cm): A$_{312}$=0.598.

Example 6

Preparation of Mid M$_w$ C$_3$-MMA-ttc

A 4-neck flask fitted with condenser, nitrogen gas inlet, thermocouple and initiator feed line, Raman probe, and an overhead stirrer assembly was charged with C$_3$-RAFT agent CH$_3$C[CH$_2$OC(O)CH$_2$CH$_2$C(CH$_3$)(CN)SC(S)SC$_{12}$H$_{25}$]$_3$ (FW=1275.5, 2.38 g=5.61 mequiv trithiocarbonate ends), MEK (110 mL), and MMA (100 g, 1.00 mol). Luperox® 26 initiator solution was prepared for syringe pump feeding as follows: 106 mg/20.0 mL, (0.0245 mmol/mL), using MEK as solvent. The reactor was purged with nitrogen for 20 min. The temperature was increased to 75° C., and 5.0 mL of initiator solution was fed. After adjusting for the slow feed conditions (0.30 mL/hr), the pump was started, and slow feed was continued for 18 hr. High viscosity mixing limitation occurred when MMA conversion was ca. 82%.

The reaction mixture was diluted with MEK (70 mL), and the solution was added to methanol to precipitate the product. SEC (linear PMMA calibration): Mw=47,620; Mn=45,380; Mz=49,450; PD=1.05. There was no detectable arm coupling. UV (1.00 g/L, THF): A$_{310}$=0.863.

Example 7

Preparation of Mid M$_w$ C$_3$-MMA-b-S-ttc

A 3-neck 500 mL flask fitted with condenser, nitrogen gas inlet, thermocouple and Raman probe was charged with 45.0 g of C$_3$-PMMA-ttc (Mw=47620), 2-heptanone (75 g), and 93.6 g (0.90 mol) of styrene. A nitrogen purge sequence was followed for 20 min. The reaction mixture was heated to 91° C. for 2 hr, 100° C. for 2 hr, and 114° C. for 19 hr. Styrene conversion was determined as 52%.

The polymer solution was treated with hexanes to afford light yellow solids which were filtered and air dried to provide 82.4 g. The product was treated with cyclohexane (750 mL) and heated in a 45° C. bath (36° C. internal) for 0.5 hr. The liquid phase was removed at temperature with a fritted dip-tube, and the process was repeated. Solids were treated with methanol, filtered and dried to provide 80 g of polymer. $^1$H NMR analysis (CDCl$_3$): using integration of S and MMA polymer signals, monomer ratio in the polymer was calculated as MMA/S=52.6/47.9. Core CH$_2$O intensity=1.435; CH$_2$S intensity=1.548; total MMA=100/H, total S=90.2/H. Estimated arm Mn=13,900+13,080=26,980. SEC (vs. linear PMMA standards): Mw=94,960; Mn=78,520; Mz=109,550; PD=1.20. A small amount of arm coupling product was present. UV (1.0 g/L THF 1 cm, −134 B): A$_{312}$=0.381.

AFM analysis of a thin film prepared on cross-linked S/MMA/GMA neutral layer showed L$_o$=21.8 nm.

Example 8

Preparation of High M$_w$ C$_3$-MMA-ttc

A 4-neck flask fitted with condenser, nitrogen gas inlet, thermocouple and initiator feed line, and an overhead stirrer assembly was charged with C$_3$-RAFT agent CH$_3$C[CH$_2$OC(O)CH$_2$CH$_2$C(CH$_3$)(CN)SC(S)SC$_{12}$H$_{25}$]$_3$ (FW=1275.5, 2.38 g=5.61 mequiv trithiocarbonate ends), MEK (135 mL), and MMA (100 g, 1.00 mol). Luperox® 26 initiator solution was prepared for syringe pump feeding as follows: 106 mg/20.0 mL (0.0245 mmol/mL), using MEK as solvent. The reactor was purged with nitrogen for 20 min. The temperature was increased to 75° C., and 5.0 mL of initiator solution was fed. Slow initiator feed was continued for 35 hr. $^1$H NMR (CDCl$_3$) showed final MMA conversion=91%. Polymer solution was precipitated into hexanes to provide 86 g of yellow solids after filtration and drying. SEC (linear PMMA calibration): Mw=52,350; Mn=48,750; Mz=55,480; PD=1.07. UV: A309=0.806.

Example 9

Preparation of High M$_w$ C$_3$-MMA-b-S-ttc

A 3-neck 500 mL flask fitted with condenser, nitrogen gas inlet, thermocouple, Raman probe, and an overhead stirrer assembly was charged with 45.0 g of C$_3$-PMMA-ttc (Mw=52,350), 2-heptanone (75 g), and 93.6 g (0.90 mol) of styrene. A nitrogen purge sequence was followed for 20 min. The reaction mixture was heated to 95° C. for 2 hr, 105° C. for 1 hr, and 114° C. for 18 hr. Styrene conversion was estimated as 65%.

The reaction mixture was diluted with MEK (200 mL), heated to 65° C. to achieve uniformity, and transferred to a 3 L vessel. Hexanes (2 L) were added slowly with stirring. After 0.5 hr, fritted dip-tube was used to remove bulk of solvent. Hexane (1 L) was added and the mixture was stirred for 0.5 hr. Liquid was removed, and methanol (1 L) was added. After stirring 0.5 hr, mixture was filtered and solids were washed with methanol to provide 96.3 g of light yellow solids after filtration, and air-drying. A small amount of polystyrene homopolymer was present as judged by IPC analysis. This was removed by treatment with cyclohexane extraction at ca. 40° C., cooling to room temperature, treatment with methanol followed by filtration and drying. $^1$H NMR analysis (CDCl$_3$): Using integration of S and MMA polymer signals, monomer ratio was calculated as MMA/S=47.6/52.4. Using integrated core CH$_2$O intensity, the calculated arm Mn was estimated as 32,160; or an overall Mn=96,500. The value is in reasonable agreement with SEC data below. SEC (vs. PMMA standards): Mw=138,400; Mn=114,200; Mz=172,600; PD=1.21. A small fraction of arm-coupled product was present. UV (1.0 g/L THF 1 cm): A$_{312}$=0.320.

Comparative Example 1

Preparation of Telechelic ttc-OPMA-ttc

A 4-port flask fitted with a syringe pump device, condenser, nitrogen gas inlet, thermocouple, and an overhead stirrer assembly was charged with trithiocarbonate RAFT agent [C$_{12}$H$_{25}$SC(S)SC(CH$_3$)(CN)CH$_2$CH$_2$C(O)OCH$_2$]$_2$(C$_6$H$_4$), (FW=908, 7.56 g =8.33 mmol), MEK (60 mL), and octafluoropentyl methacrylate (100.0 g, 0.33 mol). Luperox® 26 initiator solution was prepared for syringe pump feeding as follows: 152 mg/20.0 mL (0.035 mmol/mL), using MEK as solvent. The reactor was purged with nitrogen for 20 min. The temperature was increased to 76° C., and 5.0 mL of initiator solution was added. Continuous slow addition at 0.4 mL/hr was used thereafter. Heating was continued for 19 hr. OPMA conversion was determined as 94.7%.

The polymer solution was diluted with 25 mL MEK and was added slowly to stirred hexanes 1000 mL. Precipitated polymer was washed 2× with 600 mL hexanes, filtered, air-dried, and pumped to give solids, 95.9 g. Integration of central core signals vs. OPMA CF$_2$H was consistent with dp =44.5 (theory=40). SEC in THF showed: non-uniform RI response across the eluted peak—positive and negative components, not allowing for further analysis. UV (1.00 g/L, THF): A$_{308}$=1.862.

Comparative Example 2

Preparation of ttc-S-b-OPMA-b-S-ttc

A 3-neck flask fitted with condenser, nitrogen gas inlet, Raman probe, and thermocouple was charged with 50 g of ttc-OPMA-ttc (calculated as 7.9 mmol RAFT ends), 2-heptanone (40 g), and 71.0 g of styrene. A nitrogen purge sequence was followed for 20 min. The reaction mixture was heated to 95° C. for 2 hr, 105° C. for 1 hr, and 114° C. for 18 hr. Styrene conversion was estimated as 54.0%.

The cooled mixture was diluted with MEK and added slowly into hexanes to provide 85.0 g of yellow solids after filtration and air-drying. $^1$H NMR analysis of above bulk solids (CDCl$_3$): OPMA/S 29.7/70.3 (mol %), based on aromatic region integral=1,268; 6.05 triplet a=106.9, OCH$_2$ a=200.0; internal aromatic-CH$_2$O signals=8.67, —SCH$_2$ a=7.93.

An aliquot was treated with cyclohexane, using a centrifuge to separate insoluble polymer and the liquid phase. $^1$H NMR analysis of the resulting polymer (CDCl$_3$) showed slightly reduced styrene content: OPMA/S 29.9/70.1 (mol %). SEC data vs. PMMA: Mw=24,800; Mn=21,700; Mz=27,800; PD=1.14. UV (1.0 g/L THF 1 cm): A$_{312}$=1.138.

Comparative Example 3

End-Group Reduction of ttc-S-b-OPMA-b-S-ttc

A sample of ttc-S-b-OPMA-b-S-ttc (75.0 g, estimated as 6.7 mmol trithiocarbonate ends) was added along with dimethylacetamide (DMAC, 100.0 g) in a 500 mL 3-neck round bottom flask fitted with an overhead stirrer assembly, internal thermocouple, reflux condenser, nitrogen gas inlet, and adapter for syringe pump tubing. The mixture was heated gradually to 80° C. The solution was cooled slightly and treated with triethylammonium hypophosphite dissolved in 8 g DMAC and stirred (80° C.) to provide a homogeneous solution. The reaction mixture was purged with nitrogen for 20 min, and then heated to 103° C. An initiator solution, prepared using Luperox® P initiator (850 mg dissolved in 11.24 g DMAC (vol=12.00 mL)), was added using a syringe pump according to the following schedule: 0.4 mL at hourly intervals for the first 6 hr, then additional 0.4 mL aliquots from t=20 hr to t=32 hr. A total of 8.1 mL of initiator solution was added.

The polymer solution was cooled, transferred to a 3 L flask, and slowly treated with 1500 mL of isopropanol/water (2/1) with stirring. The liquid phase was removed with a dip-tube, and the solid was redissolved in 150 ml MEK. Additional 1200 mL of isopropanol/water (2/1) was added, and the liquid phase was removed with a dip-tube. The solid was washed with 1200 mL of isopropanol/water (2/1). Solids were filtered and dried to provide 70.0 g of a white solid. $^1$H NMR overlay trace with starting material showed superimposable S, OPMA, and central core OCH$_2$ signals, and the complete absence of SCH$_2$ groups. Mol ratio of OPMA(106.9/H)/S(253.5/H) was 29.7/70.3, equivalent to 54.9/45.1 wt % or 43.6/56.4 vol %, based on monomer densities of 1.432 g/cm$^3$ for OPMA and 0.909 g/cm$^3$ for S. SEC analysis indicated the presence of styrene homopolymer carried over with starting material sample. The crude product was then treated with cyclohexane as follows:

The bulk sample was treated with cyclohexane (300 mL) and heated to ca. 45° C. The mixture was cooled to room temp with slow stirring, and then further cooled to ca. 10-13° C. to provide larger particle size. The bath was removed to allow the mixture to equilibrate at room temp. ca. 20-22° C. The contents were subjected to centrifugation, and the supernatant was decanted. Solids were rinsed with cyclohexane and re-centrifuged. Polymer was recollected, dissolved in MEK and re-precipitated by addition of isopropanol. Filtration and drying gave 50.5 g of white solids.

$^1$H NMR(CDCl$_3$): OPMA/S=31.0/69.0 mol %, which corresponds to 56.4/43.6 wt %, or 45.1/54.9 vol %, using monomer densities. SEC (PMMA standards) showed that the low molecular weight component had been removed. Mw=25,000; Mn=21,700, Mz=28,400; PD=1.15.

A sample of polymer powder was prepared for SAXS according to the procedure used for OPMA-b-S diblock example. Scattering intensities were consistent with d-spacing of 13.2 nm.

AFM image of S-b-OPMA-b-S (on cross-linked S/OPMA/GMA neutral layer) after annealing with PGME vapor (room temp., 2 hr) showed partial formation of a vertical lamellar pattern.

Comparative Example 4

Preparation of OPMA-ttc

A 4-port flask fitted with a syringe pump device, condenser, nitrogen gas inlet, thermocouple, and an overhead stirrer assembly was charged with trithiocarbonate RAFT agent (RAFTv2.0) C$_{12}$H$_{25}$SC(S)SC(CH$_3$)(CN) CH$_2$CH$_2$CO$_2$CH$_3$ (4.96 g=11.9 mmol), MEK (60 mL), and octafluoropentyl methacrylate (90.0 g, 0.30 mmol). Luperox® 26 initiator solution was prepared for syringe pump feeding as follows: 152 mg/20.0 mL (0.035 mmol/mL), using MEK as solvent. The reactor was purged with nitrogen for 20 min. The temperature was increased to 75° C., and 5.0 mL of initiator solution was fed. Continuous slow feed (0.3 mL/hr) was used thereafter for 33 hr. Conversion was 97%.

The polymer solution was diluted with 50 mL MEK and was added slowly to stirred hexanes 600 mL. The precipitated polymer was washed twice with 600 mL hexanes, filtered, air-dried, and pumped to give a solid, 86 g. NMR (THF-d8): 6.55 (t, a=33.7), 4.60 (bd m, a=67), 3.25 (bd m, a =1.64); predicted dp ca. 40. After precipitation, apparent dp was calculated as 44. UV (1.00 g/L, THF): A$_{309}$=1.213. SEC (THF, vs. PMMA): Mw=12,650; Mn=11,550; Mz=13,850; PD=1.10.

Comparative Example 5

Preparation of OPMA-b-S-ttc

A 4-neck flask fitted with condenser, nitrogen gas inlet, thermocouple, and Raman probe was charged with 50 g of OPMA-ttc (calculated as 6.82 mmol trithiocarbonate ends), 2-heptanone (40 g), and 71.0 g (0.683 mol) of styrene. A nitrogen purge sequence was followed for 20 min. The reaction mixture was heated at 95° C. for 2 hr, 105° C. for 1 hr, and 115° C. for 20 hr. Styrene conversion was determined as 53.9%.

The reaction mass was diluted with THF (55 mL) and product was precipitated by addition of hexanes (1500 mL). Solvent was removed with a dip-tube. The solids were dissolved in 120 mL THF and precipitated by addition of 1500 mL hexanes. The liquid phase was removed, and additional hexanes was added to wash the polymer and reduce to small particles. Filtration and drying provided 80.6 g of light yellow solids. IPC showed: no detectable homopolymers. $^1$H NMR analysis of above bulk solids (CDCl$_3$): OPMA/S 32.6/67.4 (mol %), based on aromatic region integral=1,084; 6.05 triplet a=105.7, OCH$_2$ a=200.0; OCH$_3$ ends integral=7.42 (2.47/H). Calculated OPMA dp=42.5, S dp=87.8. UV (THF, 1.00 g/L,1 cm): A$_{311}$=0.731. SEC (THF vs. PMMA): Mw=19040, Mn=17841, Mz=20780, PD=1.08.

Comparative Example 6

End-Group Reduction of OPMA-b-S-ttc

Sample of OPMA-b-S (75.0 g, estimated as 5.48 mmol trithiocarbonate) was added to dimethylacetamide (DMAC, 100.0 g) in a 500 mL 3-neck round bottom flask fitted with an overhead stirrer assembly, internal thermocouple, reflux condenser, nitrogen gas inlet, and adapter for syringe pump tubing. The mixture was heated gradually to 80° C. The solution was cooled to 50° C. and treated with triethylammonium hypophosphite (6.36 g, 38 mmol) dissolved in 6 g DMAC and stirred at 80° C. to give a clear solution. The reaction mixture was purged with nitrogen for 20 min, and then heated to 103° C. A solution of Luperox® P initiator was prepared as follows: 0.340 g was dissolved in 5.622 g DMAC (vol=6.00 mL); a syringe pump was used for addition through PE tubing.

Initiator feed schedule: 0.40 mL at t=0, then four 0.20 mL additions were made at hourly intervals for 4 hr. After 18 hr, two additional 0.4 mL additions were made; after 21 hr, the solution became completely colorless.

The polymer solution was cooled, transferred to a funnel, and added slowly with stirring to 1500 mL of isopropanol/water (2/1). The liquid phase was removed with a dip-tube, and the solids were washed in the vessel with 1200 mL of isopropanol/water (2/1). Product was filtered and air-dried to provide a white solid.

To remove small contaminants, processing was continued as follows:

The polymer was dissolved in 150 mL MEK, added slowly to 1500 ml of isopropanol/water (2/1) with vigorous stirring. The liquid phase was removed with a dip-tube, and the solids were washed in the vessel with 1200 mL of isopropanol/water (2/1). Drying (air drying overnight) provided 70.6 g of white solids. The precipitation process was repeated, using a 0.45 micron membrane to filter the MEK polymer solution. There was obtained 68.4 g after vacuum drying (at 60° C., $N_2$ make up).

$^1$H NMR (CDCl$_3$): OPMA/S was measured as 31.7/68.3. Other contaminants were below detection limit. Measured OPMA/S content was 31.7/68.3 mol %, equivalent to 57.3/42.7 wt %. Using OPMA monomer density=1.432 g/cm$^3$ and styrene monomer density=0.909 g/cm$^3$, the corresponding estimated volume fraction is calculated as 46.0/54.0. UV (THF, 1.00 g/L, 1 cm): $A_{311}$=0.00. SEC (vs. PMMA standards): Mw=19,040; Mn=17,400; Mz=20,800; PD=1.04. SEC (triple detection): Mw =20,770; Mn=20,580; Mz=20,950. Coupling was below detection limit. DSC: Tg's at 34.5° C. and 92° C. Melting endotherm on first heat at ca. 58° C., 1.4 J/g.

Example 10

Preparation of C$_3$-OPMA-ttc

A 4-neck flask fitted with condenser, nitrogen gas inlet, thermocouple and initiator feed line, Raman probe, and an overhead stirrer assembly was charged with C$_3$-RAFT agent CH$_3$C[CH$_2$OC(O)CH$_2$CH$_2$C(CH$_3$)(CN)SC(S)SC$_{12}$H$_{25}$]$_3$ (FW=1275.5, eq. wt=425/trithiocarbonate end; 6.69 g=15.75 mequiv); and trifluorotoluene (97.5 mL), and 34 g OPMA. Another 101 g portion of OPMA was loaded in a syringe pump set to feed over a 4 hr period. A Luperox® 26 initiator solution was prepared in trifluorotoluene for syringe pump feeding as follows: 159 mg/20.0 mL, (0.03675 mmol/mL). The reactor was purged with nitrogen for 20 min. The temperature was then increased to 75° C. Initiator solution was fed at 12 mL/hr (volume=5.0 mL) and then stopped. After adjusting for the slow feed conditions (0.40 mL/hr), the pump was started, and a slow feed was continued. OPMA monomer feed was started at the same time, and completed in 4 hr. Additional 2.0 mL of initiator was fed at 24 hr. Total batch time was 35 hr, at which time OPMA conversion was 93%.

The cooled solution was added dropwise to 2 L hexanes with stirring. Liquid phase was removed with a dip-tube. Another 2 L portion of hexanes was added, and the mixture was stirred for 1 hr. Polymer was isolated by filtration. Air-drying provided 125.5 g of yellow solid. SEC (linear PMMA calibration): showed Mw=29,360; Mn=27,760; Mz=31,080; PD=1.06.

NMR (CDCl$_3$): 6.03 (t, a=100.8), 4.40 (bd m, a=193), 4.00 (CH$_2$O, core, a=7.03), 3.35 (apparent t, a=1.79), 3.25 (m, a=4.45); in THF-d8: 6.55 (t), 4.6 (sharper m, a=342.6), 4.02 (m, a=11.2), 3.38 (apparent t, a=2.69), 3.27 (m, a=7.82). Using OPMA, OCH$_2$ and core CH$_2$O signals, overall dp is estimated as 170.4/1.87=91. Thus, arm dp is estimated as 30.4.

Additional molecular weight samples of C$_3$-OPMA-ttc (Mw=26.4K, 38.9K) were prepared by similar processes using varied ratios of OPMA monomer and C$_3$-RAFT agent.

Example 11

Preparation of C$_3$-OPMA-b-S-ttc

A 3-neck flask fitted with condenser, nitrogen gas inlet, thermocouple, Raman probe, and an overhead stirrer assembly was charged with 50 g C$_3$-OPMA-ttc (Mw=29,360), 2-heptanone (50 g), and 71.0 g of styrene. A nitrogen purge sequence was followed for 20 min. Heating was maintained for 2 hr at 90° C., 1 hr at 105° C., then 24 hr at 114° C. Styrene conversion was estimated as 55%.

The reaction mixture was diluted with 50 mL MEK and added slowly to 2 L hexanes with stirring under $N_2$. The liquid phase was removed with a dip-tube. Additional hexane (500 mL) was added. After stirring for 0.5 hr, the liquid phase was removed. Isopropanol (1 L) was added and the mixture was stirred for 0.5 hr. The yellow solids were filtered and air-dried. There was obtained 87.8 g of yellow solids. $^1$H NMR analysis of above bulk solid (CDCl$_3$): OPMA/S 28.7/7.3 (mol %). SEC (vs. PMMA): Mw=41,200; Mn=30,600); a small amount of low molecular weight (ca. 10,000) polystyrene was present.

Processing to remove polystyrene homopolymer:

The above isolated solids were treated with cyclohexane (500 mL) and stirred at 45° C. for 0.5 hr, centrifuged (4000 rpm/5 min, warm), and the liquid phase was decanted. Another portion of cyclohexane (500 mL) was added, and the operation was repeated twice. Isopropanol (500 mL) was added to the polymer phase, and the mixture was stirred 0.5 hr, filtered, air-dried, and vacuum oven dried to give 56.3 g of purified C$_3$-OPMA-b-S-ttc, as a light yellow solid. Latter portions of cyclohexane supernatant were re-worked to provide 21 g of slightly less pure C$_3$-OPMA-b-S-ttc.

$^1$H NMR (CDCl$_3$): OPMA/S 30.5/69.5 (mol %), equivalent to 55.9/44.1 wt % or 45/55 vol %, based on monomer densities of 1.432 g/cm$^3$ for OPMA and 0.909 g/cm$^3$ for S. NMR: Using core and monomer integrated signals, overall dp's were calculated as OPMA=101, styrene=235. Estimated Mn was thus 30,300+24,453=54,753 (arm Mn=18, 250). SEC (RI only, vs. PMMA standards): Mw=43470, Mn=36650, MP=41180; PD=1.186. SEC (triple detection): Mw=56.73 kDa; Mn=54.5 kDa; PD=1.04.

Example 12

Preparation of High $M_w$ C$_3$-OPMA-ttc

A 4-neck flask fitted with condenser, nitrogen gas inlet, thermocouple and initiator feed line, Raman probe, and an overhead stirrer assembly was charged with C$_3$-RAFT agent CH$_3$C[CH$_2$OC(O)CH$_2$CH$_2$C(CH$_3$)(CN)SC(S)SC$_{12}$H$_{25}$]$_3$ (FW=1275.5, 3.16 g=7.44 mequiv. RAFT ends), DMAC (75 mL), and OPMA (90.0 g, 0.30 mol). Luperox® 26 initiator solution was prepared for syringe pump feeding as follows: 106 mg/20.0 mL, 0.0245 mmol/mL, using MEK as solvent. The reactor was purged with nitrogen for 20 min. The temperature was increased to 75° C., and 5.0 mL of Initiator solution was fed. Slow feed conditions (0.40 mL/hr) were established and continued for 24 hr. $^1$H NMR (CDCl$_3$) showed final OPMA conversion was 94.3%.

MEK (50 mL) was added to the reaction mixture and the solution was added dropwise to 2 L hexanes with stirring. Liquid phase was removed with a dip-tube. Another 2 L portion of hexanes was added, and mixture was stirred for 0.5 hr. The polymer-rich phase was washed with isopropanol. The isopropanol phase was removed and the polymer was pumped to constant weight. SEC (vs. PMMA calibration): Mw=38,900, Mn=34,100, Mz=43,500, PD=1.14. From NMR integration of OPMA and core signals the average dp was estimated as 133.

Example 13

Preparation of High $M_w$ $C_3$-OPMA-b-S-ttc

A 3-neck flask fitted with condenser, nitrogen gas inlet, thermocouple, Raman probe, and an overhead stirrer assembly was charged with 50 g $C_3$-OPMA-ttc (Mw=38,900, estimated as 4.4 mmol trithiocarbonate ends), 2-heptanone (50 g), and 71.0 g of styrene. A nitrogen purge sequence was followed for 20 min. Heating was maintained for 2 hr at 90° C., 2 hr at 105° C., then 23 hr at 114° C. Styrene conversion was estimated as 54%.

The reaction mixture was diluted with 50 mL MEK and added slowly to 2 L hexanes with stirring under $N_2$. The liquid phase was removed with a dip-tube. Additional hexane (500 mL) was added. After stirring for 0.5 hr, the liquid phase was removed. Isopropanol (1 L) was added and the mixture was stirred for 0.5 hr. The yellow solid was filtered and air-dried. There was obtained 82.4 g of yellow solids. $^1$H NMR analysis of above bulk solid (CDCl$_3$): OPMA/S 29.3/70.7(mol %). SEC (vs. PMMA): Mw=63,860; Mn=43800); a small amount of low molecular weight (ca. 10,000) polystyrene was present.

Processing to remove polystyrene homopolymer:

The above isolated solid was treated with cyclohexane (500 mL) and stirred at 45° C. for 0.5 hr, centrifuged (4000 rpm/5 min, warm), and the liquid phase was decanted. Another portion of cyclohexane (500 mL) was added, and the operation was repeated twice. Isopropanol (500 mL) was added to the polymer phase, and the mixture was stirred 0.5 hr, filtered, air-dried, and vacuum oven dried to give 80.0 g of purified $C_3$-OPMA-b-S-ttc, as a light yellow solid.

$^1$H NMR (CDCl$_3$): OPMA/S 30.9/69.1 (mol %), equivalent to 56.3/43.7 wt % or 45/55 vol %, based on monomer densities of 1.432 g/cm$^3$ for OPMA and 0.909 g/cm$^3$ for S. NMR: Using core and monomer integrated signals, overall dp's were calculated as OPMA=160, styrene=357. Estimated Mn was thus=85,100 (arm Mn=28,400). SEC (vs. PMMA standards): Mw=66,200; Mn=55,360; Mz=78,500; PD=1.20. SEC (triple detection): Mw=88.1 kDa; Mn=85.1 kDa; Mz=91.0 kDa; PD=1.04

SAXS analysis: A powder sample was obtained by inverse precipitation from MEK using isopropanol/water mixtures. Scattering intensity analysis showed HCP cylinders with spacing ca. 18.3 nm.

Example 14

Preparation of $C_3$-OPMA-b-S-ttc (Cylindrical)

A 3-neck flask fitted with condenser and nitrogen gas inlet, 37.5 g of $C_3$-OPMA (calculated as 4.397 mmol trithiocarbonate ends), 2-heptanone (37.5 g), and 137.1 g of styrene. A nitrogen purge sequence was followed for 20 min. The reaction mixture was heated to 95° C. for 2 hr, 105° C. for 1 hr, and 115° C. for 21 hr. Styrene conversion was estimated as 61.6%.

The reaction mixture was diluted with 80 mL MEK and added slowly to 2 L hexanes with stirring under $N_2$. Liquid phase was removed with a dip-tube. Additional hexane (1000 mL) was added. After stirring for 0.5 hr, the liquid phase was removed. Isopropanol (500 mL) was added and the mixture was stirred for 0.5 hr. The resulting yellow solid was filtered and air-dried to provide 121 g of yellow solids. SEC data vs. PMMA: showed a small fraction of low molecular weight polystyrene homopolymer present.

The crude solid was treated with cyclohexane (500 mL) and stirred at 45° C. for 0.5 hr, centrifuged (4000 rpm/5 min, warm), then allowed to cool, and the liquid phase was decanted. Cyclohexane (500 mL) was added, and the operation was repeated twice. Isopropanol (500 mL) was added and the mixture was stirred 0.5 hr, filtered, air-dried, and vacuum oven dried to give 98 g of purified polymer. $^1$H NMR analysis (CDCl$_3$): OPMA/S 14.7/85.3 (mol %), based on aromatic region integral=2893.6; —CF$_2$H triplet at 6.05 (a=105), OCH$_2$ bd 4.4, a=200; core OCH$_2$ signal a =6.18, terminal SCH$_2$=4.55. The mol ratio of OPMA/S=14.7/85.3, is equivalent to 33.2/66.8 wt % or 24/76 vol %, based on monomer densities of 1.432 g/cm$^3$ for OPMA and 0.909 g/cm$^3$ for S.

General Procedure for Particle Growth (SAXS Analysis).

A 0.75 g polymer sample was dissolved in 2 g MEK. (no light scattering). Solution was treated drop-wise with a 30/70 mixture of MEK/i-PrOH+H$_2$O(3/1) (3 g). Laser pen light showed significant light scattering. This increased with further solvent mixture addition. Addition was continued, resulting in particle growth and formation of a polymer-rich phase. The solids were allowed to settle, and the top liquid phase was removed. Then isopropanol/water (3/1) solution was added in 3 mL portions. After each addition, the particles were stirred briefly, then allowed to settle. The liquid portion was removed after each addition (4×). Solid was isolated by filtration and air-drying (90% mass recovery). SAXS analysis showed lamellar d spacing of 15.5 nm.

Neutral Layer Preparations—MMA/S/GMA for Neutral Layer and Brush Polymer (DSA Aplications)

A 4-neck flask (250 mL) fitted with condenser, nitrogen gas inlet, an adaptor accommodating a septum for initiator solution feed (syringe pump), thermocouple, and an overhead stirrer assembly was charged with toluene (45 mL), MMA (10.8 g, 108.0 mmol, styrene (30.2 g, 290.7 mmol), and glycidyl methacrylate 2.35 g, 16.5 mmol. Azo-bis (isobutyronitrile) (AIBN) initiator (FW=164, 585 mg, 3.57 mmol) in 15 mL toluene was charged to a syringe pump. The reactor was purged with nitrogen for 20 min. Internal temperature was increased, and initiator solution was started at 1 mL/min when the temperature reached 70° C. Heating was continued for 8 hr.

$^1$H NMR analysis showed S conversion was ca. 70%. Residual monomer ratio was determined as S/MMA/GMA=82.2/15.3/2.5. From the quantities of monomers charged, the calculated polymer composition was thus S/MMA/GMA=65.9/29.7/4.5. $^1$H NMR analysis of the isolated and dried polymer was consistent with this monomer ratio. SEC (THF, vs. PMMA): Mw=28,745; Mn=17260, Mz=43600, MP=25500, PD=1.70. IPC showed single peak at 17.35 min).

Preparation of S/OPMA/GMA Neutral Layers

A 250 mL 4-neck reaction vessel, equipped with addition funnel, reflux condenser, nitrogen inlet, and magnetic stir bar was charged with MEK (40 mL), styrene (18.3 g, 176 mmol), glycidyl methacrylate (GMA, 1.28 g, 9.0 mmol), and octafluoropentyl methacrylate (OPMA, 22.5 g, 75 mmol). The reactor was purged with nitrogen for 15 min, and then heated to 72° C. A solution of AIBN (0.35 g, 2.1 mmol) in 5.0 mL MEK was added during a 10-minute interval. Heating was continued for 10 hr. Styrene conversion was estimated as 71%, OPMA as 93%, and GMA as 85%.

Most of the MEK was removed under vacuum, and residual monomers were partitioned into hexanes. There was obtained 27 g of white solid after vacuum drying. SEC (THF, RI): Mw=46,400; Mn=31,500; Mz=64,700; PD=1.48.

Polymer composition was determined as S/OPMA/GMA=61.6/34.2/4.1 (mol %).

Neutral Layer Cross-Linking Procedure using S/MMA/GMA

A neutral layer was prepared from a formulated solution as follows: 10 g solution of 5 wt % (0.500 g, 0.235 mequiv epoxide) in PGMEA (9.467 g), 1,1,1-tris(hydroxymethyl)ethane (FW=120.15; 10 mg=0.235 mequiv hydroxyl groups), triphenylsulfonium nonaflate (0.0145 g) was prepared. 1.00 g of this solution was diluted with 4.00 g PGMEA for spin coating. This solution was filtered, spun onto silicon wafer (800/2500 rpm), UV exposed (254 nm/2 min), then heated at 180° C. for 30 min.

Neutral Layer Cross-Linking Procedure using S/OPMA/GMA

A neutral layer was prepared from a formulated solution as follows: 10 g solution of 5 wt % (0.500 g, 0.120 mequiv epoxide) in PGMEA (9.467 g), 1,1,1-tris(hydroxymethyl)ethane (FW=120.15; 12 mg=0.12 mequiv hydroxyl groups), triphenylsulfonium nonaflate (0.0090 g) was prepared. 1.00 g of this solution was diluted with 4.00 g PGMEA for spin coating. This solution was filtered, spun onto silicon wafer (800/2500 rpm), UV exposed (254 nm/2 min), then heated at 180° C. for 30 min. Surface energy was determined as ca. 28 dynes/cm.

Compositions from Comparative Examples 2 and 3 (CE2 and CE3, linear triblock copolymers), Comparative Examples 5 and 6 (CE5 and CE6, diblock copolymers) and Examples 11 and 13 (E11 and E13, substantially symmetrical 3-arm star block copolymers) were cast onto Si substrates having cross-linked S/OPMA/GMA neutral layers. Using Atomic Force Microscopy (AFM), images of the six samples clearly show the more sharply defined contrast of the substantially symmetrical 3-arm star compositions (E11 and E13) and their greater coherence length, when compared to the linear triblock (CE2 and CE3) and diblock (CE5 and CE6) compositions, providing evidence of the better phase separation over longer range of the substantially symmetrical 3-arm star compositions.

While specific reaction conditions, reactants, and equipment are described above to enable one skilled in the art to practice the invention, one skilled in the art will be able to make modifications and adjustments which are obvious extensions of the present inventions. Such obvious extensions of or equivalents to the present invention are intended to be within the scope of the present invention, as demonstrated by the claims which follow.

What is claimed is:

1. A composition of matter comprising a 3-arm star block copolymer having a central core and diblock copolymer arms having inner blocks and outer blocks, wherein:
   (a) the central core is derived from a structure having the formula $R_1C[(AO)(C(O)(CH_2)_2C(CH_3)(CN))SC(S)Z]_3$, wherein $R_1$ is selected from the group consisting of H, $CH_3$, and $C_2H_5$; A is selected from the group consisting of $CH_2$, and 4-substituted $C_6H_4$; and Z is $SR_2$, wherein $R_2$ is selected from the group consisting of $C_1$-$C_4$ alkyl, $C_{12}H_{25}$ and $C_6H_5$;
   (b) the inner blocks are derived from the polymerization of Monomer 1,

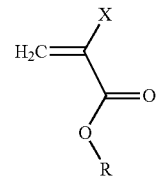

Monomer 1 wherein X is H or methyl, R is selected from the group consisting of $C_1$-$C_8$ alkyl and partially fluorinated alkyl groups, optionally substituted with hydroxyl or protected hydroxyl groups; and $C_3$-$C_8$ cycloalkyl groups; and
   (c) the outer blocks are covalently attached to the inner blocks, wherein the outer blocks are derived from the polymerization of Monomer 2,

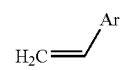

Monomer 2 wherein Ar is selected from the group consisting of a pyridyl group, a phenyl group, or a phenyl group having substituents selected from the group consisting of alkyl, hydroxyl, acetoxy, $C_1$-$C_4$ alkoxy groups, and
   —OC(O)OR', where R' is selected from the group consisting of $C_1$-$C_8$ alkyl groups.

2. The composition as set forth in claim 1, wherein Monomers 1 and 2 are selected such that the difference between the total surface energy values of a homopolymer of Monomer 1 and a homopolymer of Monomer 2 is greater than 10 dynes/cm.

3. The composition as set forth in claim 1, wherein the inner blocks comprise 5-95 wt % of the diblock copolymer arms.

4. The composition as set forth in claim 1, wherein the weight average molecular weight of the substantially symmetrical 3-arm star block copolymer is between 5,000 and 250,000.

5. The composition as set forth in claim 1, wherein R is selected from the group consisting of methyl, cyclohexyl, and a partially fluorinated alkyl group.

6. The composition a set forth in claim 5, wherein the partially fluorinated alkyl group is selected from the group consisting of —$CH_2C(CF_3)_2OH$, —$CH_2CH_2CH_2CF_2C_4F_9$, —$CH_2CH_2C_6F_{13}$, and -octafluoropentyl.

7. The composition as set forth in claim 1, wherein Ar is selected from the group consisting of pyridyl, phenyl, acetoxyphenyl, methoxyphenyl, and phenyl substituted with OC(O)OR', where R' is t-Bu.

8. The composition as set forth in claim 1, wherein the inner block is derived from the polymerization of a monomer selected from the group consisting of isobornyl methacrylate, trifluoroethyl methacrylate, trifluoropropyl methacrylate, hexafluoroisopropyl methacrylate, octafluoropentyl methacrylate, $CH_2$=$C(CH_3)CO_2CH_2C(CF_3)_2OH$ and its protected analogues, $CH_2$=$C(CH_3)CO_2CH_2CH_2CH_2CF_2C_4F_9$, $CH_2$=$C(CH_3)CO_2CH_2CH_2C_6F_{13}$, $CH_2$=$C(CH_3)CO_2CH_2CH_2C_4F_9$, $CH_2$=$C(CH_3)CO_2CH_2CH_2C_3F_7$, $CH_2$=$C(CH_3)CO_2CH_2C_2F_5$, and $CH_2$=$C(CH_3)CO_2CH_2C_3F_7$.

9. An article comprising a substrate, a block copolymer composition on the substrate, and a neutral layer between the substrate and the block copolymer composition, wherein the block copolymer composition comprises a 3-arm star block copolymer having a central core, an inner block and an outer block, wherein:
(a) the central core is derived from a structure having the formula $R_1C[(AO)(C(O)(CH_2)_2C(CH_3)(CN))SC(S)Z]_3$, wherein $R_1$ is selected from the group consisting of H, $CH_3$, and $C_2H_5$; A is selected from the group consisting of $CH_2$, and 4-substituted $C_6H_4$; and Z is $SR_2$, wherein $R_2$ is selected from the group consisting of $C_1$-$C_4$ alkyl, $C_{12}H_{25}$, and $C_6H_5$;
(b) the inner block is derived from the polymerization of Monomer 1,

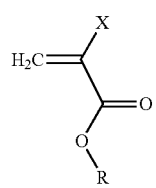

Monomer 1 wherein X is H or methyl, R is selected from the group consisting of $C_1$-$C_8$ alkyl and partially fluorinated alkyl groups, optionally substituted with hydroxyl or protected hydroxyl groups; and $C_3$-$C_8$ cycloalkyl groups; and
(c) the outer block is covalently attached to the inner block, wherein the outer block is derived from the polymerization of Monomer 2,

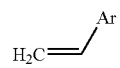

Monomer 2 wherein Ar is selected from the group consisting of a pyridyl group, a phenyl group, or a phenyl group having substituents selected from the group consisting of alkyl, hydroxyl, acetoxy, $C_1$-$C_4$ alkoxy groups, and
—OC(O)OR', where R' is selected from the group consisting of $C_1$-$C_8$ alkyl groups.

10. The article as set forth in claim 9, wherein the substrate is pre-patterned with features selected from the group consisting of curved lines, straight lines, line segments, and dots.

11. A composition of matter having the following formula:

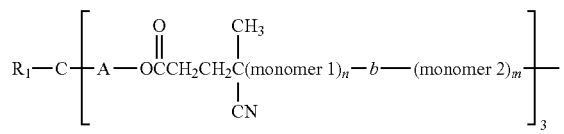

wherein:
(a) $R_1$ is selected from the group consisting of H, $CH_3$, and $C_2H_5$;
(b) A is selected from the group consisting of $CH_2$, and 4-substituted $C_6H_4$;
(c) monomer 1 is an inner block and is derived from the polymerization of Monomer 1,

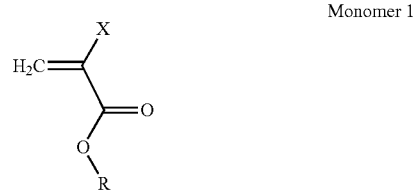

Monomer 1 wherein X is H or methyl, R is selected from the group consisting of $C_1$-$C_8$ alkyl and partially fluorinated alkyl groups, optionally substituted with hydroxyl or protected hydroxyl groups; and $C_3$-$C_8$ cycloalkyl groups; and
(d) monomer 2 is an outer block covalently attached to the inner block and is derived from the polymerization of Monomer 2,

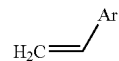

Monomer 2 wherein Ar is selected from the group consisting of a pyridyl group, a phenyl group, or a phenyl group having substituents selected from the group consisting of hydroxyl, acetoxy, $C_1$-$C_4$ alkoxy groups, and
—OC(O)OR', where R' is selected from the group consisting of $C_1$-$C_8$ alkyl groups;
(e) n is in the range of from about 10 to about 1,000; and
(f) m is in the range of from about 10 to about 1,000.

* * * * *